US005641113A

United States Patent [19]

Somaki et al.

[11] Patent Number: 5,641,113

[45] Date of Patent: Jun. 24, 1997

[54] METHOD FOR FABRICATING AN ELECTRONIC DEVICE HAVING SOLDER JOINTS

[75] Inventors: Motoaki Somaki; Masaya Sakurai, both of Tokyo, Japan

[73] Assignee: OKI Electronic Industry Co., Ltd., Tokyo, Japan

[21] Appl. No.: 458,673

[22] Filed: Jun. 2, 1995

[30] Foreign Application Priority Data

Jun. 30, 1994 [JP] Japan .................................... 6-149663

[51] Int. Cl.[6] .................................................. H01L 21/283

[52] U.S. Cl. ......................................................... 228/180.22

[58] Field of Search ......................................... 228/180.22

[56] References Cited

U.S. PATENT DOCUMENTS

| | | | |
|---|---|---|---|
| 4,376,505 | 3/1983 | Wojcik | 228/180.22 X |
| 5,001,829 | 3/1991 | Schelhorn | 228/180.22 X |
| 5,251,806 | 10/1993 | Agarwala et al. | 228/180.22 |

FOREIGN PATENT DOCUMENTS

| | | |
|---|---|---|
| 62-18049 | 1/1987 | Japan . |
| 1-218034 | 8/1989 | Japan . |
| 4-37148 | 2/1992 | Japan . |

*Primary Examiner*—Kenneth J. Ramsey
*Attorney, Agent, or Firm*—Wenderoth, Lind & Ponack

[57] ABSTRACT

Solder joints are formed on external electrodes of a semiconductor device, such as a ball grid array package or flip chip or the like, and higher solder joints are formed on the external electrodes. Each solder joint consists of a plurality of solder bumps, such as a first solder bump and a second solder bump. The process includes the steps of forming a first solder bump on an electrode, the electrode being electrically connected with a terminal of an electronic circuit, applying a first non-conductive material onto the first solder bump so as to encompass with the first non-conductive material the exposed area of the first solder bump except for a top portion of the first solder bump, and forming a second solder bump on the top portion of the first solder bump. A semiconductor device having solder joints higher than the single greatest possible solder ball for a given pitch and pad area is fabricated.

4 Claims, 2 Drawing Sheets

METHOD FOR FABRICATING AN ELECTRONIC DEVICE HAVING SOLDER JOINTS

FIELD OF THE INVENTION

The invention is generally directed to a method for fabricating an electronic device and more specifically to soldering techniques in the process of fabricating a packaged/unpackaged semiconductor device having solder joints.

BACKGROUND OF THE INVENTION

Semiconductor device packages or integrated circuit (IC) chips may, in general, operate by means of being mounted on a substrate, such as a printed circuit substrate which comprises an interconnection pattern for a circuit to be assembled, to electrically connect with other electrical/electronic devices (e.g. resistors, capacitors, ICs). For the purpose of electrically connecting to other such devices over the interconnection pattern on/in the substrate, the semiconductor device packages or the IC chips comprise a number of external electrodes, while the interconnection pattern on the substrate contains a number of contact pads to be connected to the external electrodes of the semiconductor device packages or of the IC chips.

Various methods for electrically connecting semiconductor device packages or IC chips to printed circuit substrates are well known in the art. An electrically-conductive bond (i.e. a solder bump) is used to mechanically and electrically connect to a printed circuit substrate. One such method uses "bump grid array packages (BGAPs)". A BGAP is defined as a packaged IC chip whose bonding pads bear solder bumps which are substantially truncated-sphere-shaped solidified solder. Now, one method for connecting the BGAP to the printed circuit substrate is described in the following. Firstly, a BGAP is placed so that each solder bump of the BGAP is located on its corresponding contact pads of the substrate. The solder, then, is heated to induce reflow and electrical connection between the BGAP and the substrate, and the BGAP is mounted on the substrate as a result.

A major problem associated with these types of packages or with flip chips (defined as unpackaged IC chips whose bonding pads bear solder bumps which are substantially truncated-sphere-shaped solidified solder) is inducing shear strain in the solder bumps. Shear strain is induced since the solder bumps are not flexible and there is the mismatch of thermal coefficient of expansion between the BGAP (or flip chip) and the substrate. For this reason, adequate solder joint height is needed to minimize the effects of such thermally driven fatigue. Here, the solder joint consists of at least one solder bump. In other words, needed are BGAPs( or flip chips) having solder joints higher than single greatest possible solder ball for a given pitch, pad area, etc. One attempt at a solution to this need is disclosed in Matsui et al., JP. Pat. Application No. Sho 60-156621 filed on Jul. 16, 1985. Matsui et al. describes an IC chip with solder joints which consist of solder bumps and a non-conductive film, and describes a process of fabricating such solder joints. As shown in FIG. 1, the IC chip 100 described in Matsui et al. comprises the solder joints, which consist of solder bumps 103*a*, 103*b* and the non-conductive film 107, electrically connected to corresponding bonding pads 102 of the IC chip 100. Furthermore, the non-conductive film contains electrodes 108, such as those consisting of outer layers of wettable copper and inner layers of unwettable titanium, located as corresponding to the solder bumps 103*a* and 103*b*. Each solder bump 103*a*, connected to a corresponding bonding pad 102 of the IC chip 100, may be connected through one of the electrodes 108 indirectly to one solder bump 103*b* to be connected to a contact pad 112 of a substrate 110.

Such composition of the solder joints prevents the solder bumps 103*a* and 103*b*, upon being heated, from being caused to mix with each other and to solidify forming solder joints similar to truncated spheres, each of whose volume is approximately two times greater than that of the solder bump 103*a*. Consequently, in the process of fabricating the IC chip 100, each solder bump 103*a* keeps almost the same diameter as its diameter before being electrically connected, through one of electrodes 108, to the corresponding solder bump 103*b*. Thus, the method described in Matsui et al. has an advantage of being able to increase solder joint height without increasing its diameter.

However, the non-conductive film 107 having the electrodes 108 is essentially employed in the method. Also, it is necessary to arrange the electrodes 108 of the film 107, in the same formation of an array of the external electrodes 102 engaged on an active side of the package 101, as shown in FIG. 1. In other words, the formation of the array of the electrodes 108 of the non-conductive film 107 depends on how the external electrodes 102 of the package 101 are arranged. Therefore, it is necessary to employ a non-conductive film to be assembled so as to correspond to a package applied in the process.

SUMMARY OF THE INVENTION

This invention embodies processes for forming solder joints on bonding pads of an element, such ,as a BGAP or a flip chip or the like, and accomplishes solder joints to allow for higher shear strain tolerances, greater reliability and higher conductivity. Firstly, a package having a plurality of its external electrodes is prepared. The package also contains an electronic circuit inside, such as an electronic circuit on a semiconductor chip, and the external electrodes engaged on an active side of the package are electrically connected to terminals of the electronic circuit inside the package.

Secondly, a process of forming first solder bumps on the external electrodes is performed both by stencilling flux onto the external electrodes through a first stencil and by stencilling solder balls onto the external electrodes through a second stencil. The process also involves reflowing to form the first solder bumps on the external electrodes. In the process, a quantity of flux is provided through the openings in the first stencil onto the external electrodes in the first stencilling step. Each solder ball, then, is provided through the openings in the second stencil onto each external electrode applied the flux in the second stencilling step. After processed two stencilling steps described above, the package is heated as a whole in an oven to induce reflow of the solder balls. Consequently, first solder bumps, each of which assume a shape of a truncated sphere, are formed and engaged abuttingly the external electrodes in the reflowing step.

Thirdly, carded out is a process of forming a thin layer of resin over the first solder bumps. In the embodiment of the invention, the package is soaked into fluid resin, which has a tacky or sticky characteristic at a room temperature, and then is drawn up from the fluid resin. However, it is not always necessary to form the layer of resin overall the first solder bumps, namely it is sufficient to form the resin around the first solder bumps so that only a top portion of each first solder bump can be exposed. In this case, a following removing process may be omitted.

Fourthly, carried out is a process of removing a part of the resin from each first solder bump so as to expose a top portion of each first solder bump. The top portion, exposed in the process, of each first solder bump is provided for forming a second solder bump on the top portion. The removing process means encompassing each first solder bump, which is engaged abuttingly the external electrode, with the resin but the exposed top portion.

Finally, carried out is a process of forming second solder bumps on the exposed top portions of the first solder bumps. This process is almost the similar process to the above-described process of forming first solder bumps on the external electrodes. Each second solder bump is formed on each exposed top portion of the first solder bump, namely on each first solder bump, and assumes a shape of a truncated sphere. Thus, each second solder bump is a part of solder joint, which consists of the first and the second solder bumps, engaged abuttingly the corresponding external electrode of the package. The package having the solder joints is obtained after the above-described processes.

The solder joints of the package in relation to this invention may be electrically and mechanically connected to corresponding contact pads on a printed circuit substrate, and, of course, be higher than those of a conventional BGAP. Consequently, the solder joints regarding this invention allow, by reason of those heights, for higher tolerances for the shear strain, greater reliability and higher conductivity. This invention has an advantage of being able to increase solder joint height without increasing its diameter and also has another advantage of being able to apply to various arrangement of external electrodes of a package.

Described in another embodiment of the invention is a process of fabricating a BGAP having three-bump solder joints. As described above, the two-bump solder joints, which consist of the first and the second solder bumps, are obtained after the soldering process following the applying-resin process and the exposing process. Repeatedly applying above-mentioned three processes creates higher solder joints, such as three-bump solder joints.

DETAILED DESCRIPTION OF THE PREFERRED EMBODIMENT

Figure 1:
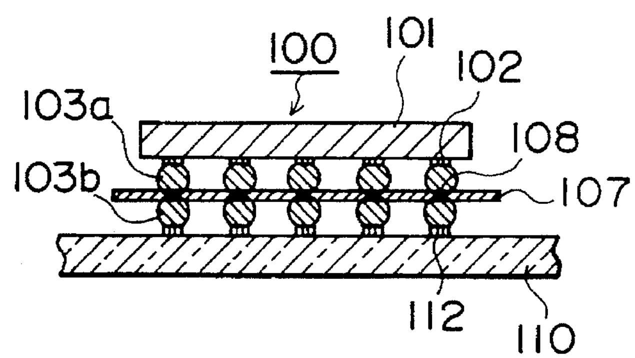
FIG. 1 is a cross sectional view of a conventional bump grid array package positioned over contact pads on a substrate.
Figure 2A:
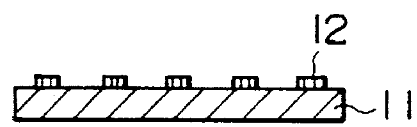
FIGS. 2*a–e* are cross sectional views of an alternate embodiment of the invention.

The preferred embodiment of the present invention incorporates processes of fabricating a BGAP having solder joints, to be connected to corresponding contact pads on a substrate, to allow for higher tolerances for the shear strain, greater reliability and higher conductivity. FIG. 2(*a*) illustrates a cross sectional view of a package 11 and of a plurality of its external electrodes 12, such as bonding pads. In this illustration, the external electrodes 12 are engaged on an active side of the package 11 and have a diameter of 0.63 millimeter. The package 11, further, contains an electronic circuit on a semiconductor chip (not shown therein) inside. The electronic circuit device, in general, operates by means of being mounted on a substrate, such as a printed circuit substrate which comprises an interconnection pattern for a circuit to be assembled, to electrically connect with other electrical/electronic devices (e.g. resistors, capacitors, ICs). For the purpose of electrically connecting to other such devices over the interconnection pattern on/in the substrate, the package 11 comprises the external electrodes 12 as shown in FIG. 2A, while the interconnection pattern on the substrate contains a number of contact pads to be connected to the external electrodes 12 of the package 11. In addition, it is accomplished, for example, by means of inner wires(not shown therein) to connect terminals of the electronic circuit inside the package 11 to corresponding external electrodes 12, to establish an electrically conductive path within the package 11 between the electronic device and the external electrodes 12.

Firstly, a process of forming solder bumps on the external electrodes 12 is carried out in a method described herein bellow. In the preferred embodiment of the invention, the process of forming solder bumps on the external electrodes 12 is performed both by stencilling flux onto the external electrodes 12 through a first stencil and by stencilling solder balls onto the external electrodes 12 through a second stencil. The process also involves reflowing to form the solder bumps on the external electrodes 12. The first stencil is a 0.15–0.20 mm. thick sheet having etched openings to allow the flux to pass through the stencil onto the external electrodes 12 of the external package 11. After alignment of the first stencil to the package 11, quantities of flux is provided through the openings in the first stencil onto the external electrodes 12. The first stencil is then removed, leaving the package 11 containing the precise amount of the flux on each external electrode 12. The flux must be a vehicle that can retain a large volume of a solder ball described hereinafter, and remove metal oxides from the surfaces of the external electrodes 12 to be soldered during the reflow process.

The second stencil is a approximately 0.4 mm. thick sheet having etched openings to allow the solder balls to pass through the stencil onto the external electrodes 12 of the package 11. After alignment of the second stencil to the package 11, each solder ball is provided through the openings in the second stencil onto each external electrode 12 applied the flux. The second stencil is then removed, leaving the package 11 mounting each solder ball on each external electrode 12. The solder balls typically are tin-lead solder and have the melting point of 183 degrees C., and require reflow temperatures in the range of 230 degrees C. The solder balls employed herein, of course, are not limited to such composition of solder, and various types of solder may be applied to the solder balls.

Figure 2B:
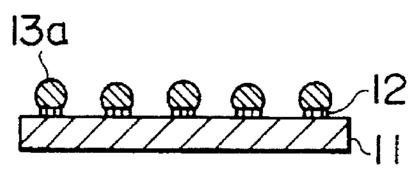

After processed two stencilling steps described above, the package 11 is heated as a whole. In the preferred embodiment, the heating means is an infrared reflow oven. The oven induces reflow of the solder balls by subjecting the unsoldered package 11 to direct infrared radiation. In the infrared reflow oven, the unsoldered package 11 is placed on a palette and passed through the oven by a conveyor. In operation, temperatures in the oven and conveyor speed are controlled adequately to solder the solder baits onto the external electrodes 12 at 230 degrees C. After the reflowing step, solder bumps 13*a* are formed and engaged abuttingly corresponding external electrodes 12, as shown in FIG. 2B. Each solder bump 13*a* assumes a shape of a truncated sphere and has a diameter of approximately 0.8 mm.

Figure 2C:
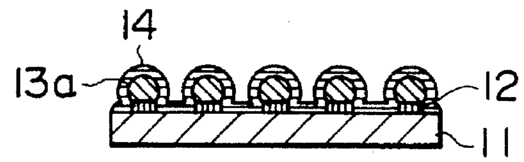

Secondly, a process of forming a thin layer of resin over the solder bumps 13*a* is carded out in a method described herein bellow. In this embodiment, the package 11 shown FIG. 2B is soaked into fluid resin, which has a tacky or sticky characteristic at a room temperature, and then is drawn up from the fluid resin. As described in detail, the whole active side of the package 11, all the external electrodes 12 and all the solder bumps 13*a* are soaked into the fluid resin at a room temperature and then are drawn up from the fluid resin, so that the thin layer of the resin is formed thereon. Preferably, the resin used herein is a thermo-harden resin, such as an epoxy resin which results from mixing a base ingredient with a hardening agent, and is characteristic of non-conductivity and fluid at a room temperature for a certain duration. Both viscosity of and temperature of the resin are controlled so that the layer of the resin over the solder bumps 13*a* is 50 micromillimeter thick. After drawn up from the fluid resin, the package 11 is heated, at 150 degrees C. for about an hour, to be hardened. After applying the resin onto the part of the package 11, as described above, the package 11 which has the solder bumps 13*a* covered with the resin 14 is obtained as shown in FIG. 2C. The solder bumps 13*a*, of course, are not molten in this process by reason that the package 11 is not heated up to the melting point of the solder. In this embodiment, the above-described soaking process is applied to the process of forming the thin layer of resin over the solder bumps 13*a*. However, the process is not limited to the soaking process, and various processes may be applied. For example, spraying the active side of the package 11 with the resin or falling drops of the resin onto the solder bumps 13*a* may also be applied to the process. In addition, it is not always necessary to form the layer of resin 14 overall the solder bumps 13*a* in this process. In other words, it is sufficient to form the resin around the solder bumps 13*a* so that only a top portion of each solder bump 13*a* can be exposed. In this case, a following removing process, which described herein below, may be omitted.

Figure 2D:
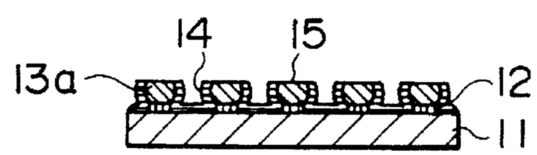

Thirdly, carded out is a process of removing a part of the resin from each solder bump 13*a* so as to expose a top portion of each solder bump 13*a*. The top portion, exposed on the process, of each solder bump 13*a* is provided for forming a solder bump on the top portion, which is described herein after. In the preferred embodiment, each exposed top portion of the solder bumps 13*a* is nearly flat, and nearly the same area, that is a circle of a diameter of 0.63 mm., as that of the external electrode 12. Therefore, it is preferable to truncate each solder bump 13*a* which is covered with the resin layer so as to expose its top portion 15, as shown in FIG. 2D. The removing process means encompassing each solder bump 13*a* with the resin but the exposed top portion 15.

Fourthly, a process of forming solder bumps on the exposed top portions 15 of the solder bumps 13*a* is carried out in a method described herein bellow. The method is almost the similar method to that of the above-described process of forming solder bumps 13*a* on the external electrodes 12. In the preferred embodiment of the invention, the process of forming solder bumps on the exposed top portions 15 is also performed both by stencilling flux onto the exposed top portions 15 through the first stencil and by stencilling solder balls onto the exposed top portions 15 through the second stencil. The process also involves reflowing to form the solder bumps on the exposed top portions 15. After alignment of the first stencil to the package 11, quantities of flux is provided through the openings in the first stencil onto the exposed top portions 15. The first stencil is then removed, leaving the package 11 containing the precise amount of the flux on each exposed top portion 15. Then, after alignment of the second stencil to the package 11, each solder ball is provided through the openings in the second stencil onto each exposed top portion 15 applied the flux. The solder balls, which are provided herein, have the same compositions as the solder balls provided in the process of forming solder bumps 13*a* on the external electrodes 12. The solder bails which are provided herein, however; are not limited to such composition of solder, and various types of solder may be applied to the solder balls. The second stencil is then removed, leaving the package 11 mounting each solder ball on each exposed top portion 15.

Figure 2E:
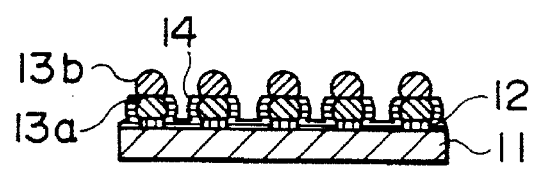
Figure 3:
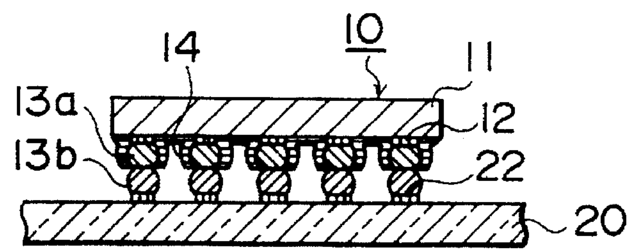
FIG. 3 is a cross sectional view of a bump grid array package, in accordance with the invention, positioned over contact pads on a substrate.

After processed two stencilling steps described above, the package 11 is heated as a whole. In the preferred embodiment, a heating means is used the same infrared reflow oven as the above-described oven. The oven induces reflow of the solder balls by subjecting the package 11 to direct infrared radiation. In the infrared reflow oven, the package 11 is placed on the palette and passed through the oven by the conveyor. In operation, temperatures in the oven and conveyor speed are controlled adequately to mix each solder ball with the corresponding solder bump 13*a* at 230 degrees C. After the reflowing step, the solder balls are solidified and formed as solder bumps 13*b*, as shown in FIG. 2E. Each solder bump 13*b* assumes a shape of a truncated sphere having a diameter of approximately 0.8 mm., and is a part of solder joint which consists of the solder bumps 13*a*, 13*b* and the resin. In the reflowing process, the resin withstands, that is it keeps its shape substantially, and still encompasses each solder bump 13*a*, for the resin is characteristic of not being molten at the highest temperature in the oven. In other words, The package 11 is heated to the temperature above the melting point of the solder, but below the melting point of the resin. In this embodiment, the resin is not molten at 230 degrees C. after solidified. Also, in the reflowing process, the resin which retains its shape prevents a lower part of the solder joints, that is the solder bumps 13*a*, from being expanded in the horizontal direction by being mixed with the solder bumps 13*b*. After several processes described above, the package 11 having the solder joints is completed as shown in FIG. 2E. In FIG. 2E, the boundary lines between the solder bumps 13*a* and 13*b* are actually invisible by reason that the solder bumps 13*a* and 13*b* are molten and mixed each other in this embodiment. But, the boundary lines are indicated therein for a better explanation of the fabricating process. The solder joints of the package 11 are electrically and mechanically connected to corresponding contact pads on a substrate, and, of course, are higher than those of a conventional BGAP. Consequently, the solder joints regarding this invention allow, by reason of those heights, for higher tolerances for the shear strain, greater reliability and higher conductivity. Such package is defined as one type of BGAP. The BGAP 10 in relation to this invention is shown in FIG. 3 to be mounted on a substrate 20, such as a printed circuit substrate.

The solder joints of the BGAP 10 are soldered with corresponding contact pads 22, to be electrically connected with other electrical/electronic devices on the substrate 20. In this embodiment, the above-described reflowing process, once again, is applied to soldering the solder joints with the contact pads 22 on the substrate 20.

Solder joints, in general, are required to assure the solder joint height needed to minimize the effects of thermally driven fatigue in the solder joints. Thus, the present method achieves reliable solder joint heights by means of the unique technique of forming solder joints, as described above. This method has an advantage of being able to increase solder joint height without increasing its diameter. The method also has another advantage of being able to apply to various arrangement of external electrodes of a BGAP. As explained in detail, the process of forming solder bumps encompassed with resin is able to be applied to various arrangement of external electrodes of a BGAP by means of the process of applying the resin to the solder bump, such as soaking the solder bumps into the resin. In addition, encompassing the solder joints with resin prevents the solder joints from contacting with neighhour solder joints.

Referring now to FIG. 4, it may be seen that a process of fabricating a BGAP 30 having a plurality of external electrodes 12 which are stacked with three solder bumps 13*a*, 13*b*, and 13*c*. In other words, each solder joint of the BGAP 30 has three bumps 13*a*, 13*b*, and 13*c*, or two constricted parts in appearance. The BGAP 30 also is in the spirit and scope of the invention. Referring again to FIG. 2, the BGAP 10 has solder joints which consist of two solder bumps 13*a* and 13*b* each. The two-bump solder joints are obtained after a soldering process following the applying-resin process and the exposing process. Repeatedly applying above-mentioned three processes creates higher solder joints, such as three-bump solder joints, than those of BGAP 10. FIG. 4 shows, as an example of its application, the process of fabricating a BGAP having three-bump solder joints.

Figure 4A:
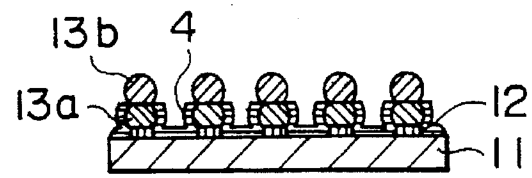
FIGS. 4*a–d* are cross sectional views of a further embodiment of the invention.
Figure 4B:
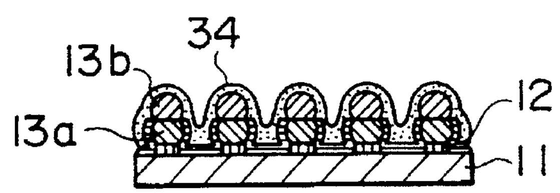

In this embodiment, BGAP 10 described in the previous embodiment will be processed furthermore. FIG. 4A illustrates a cross sectional view of a package having two-bump solder joints partly encompassed with resin, which is the same as the BGAP 10. Firstly, a process of forming a thin layer of resin over the solder bumps 13*b* is carried out in the similar method to that described in the previous embodiment. As explained once again, the package 11 shown FIG. 4A is soaked into fluid resin, which has a tacky or sticky characteristic at a room temperature, and then is drawn up from the fluid resin. As described in detail, the resin and all the solder bumps 13*b* are soaked into the fluid resin at a room temperature and then are drawn up from the fluid resin, so that the thin layer of the resin is formed thereon. Preferably, the resin used herein is the same type of resin as that used in the previous embodiment. Both viscosity of and temperature of the resin are controlled so that the layer of the resin over the solder bumps 13*b* is 50 micromillimeter thick. After drawn up from the fluid resin, the package 11 is heated, at 150 degrees C. for about an hour, to be hardened. After applying the resin onto the solder bumps 13*b*, as described above, the package 11 which has the solder bumps 13*a* and 13*b* covered with the resin 34 is obtained as shown in FIG. 4B. The solder bumps 13*a* and 13*b*, of course, are not molten in this process by reason that the package 11 is not heated up to the melting point of the solder. In this embodiment, the above-described soaking process is applied to the process of forming the thin layer of resin over the solder bumps 13*b*. However, the process is not limited to the soaking process, and various processes may be applied. For example, spraying the active side of the package 11 with the resin or falling drops of the resin onto the solder bumps 13*b* may be applied to the process. Also, it is not always necessary to form the layer of resin overall the solder bumps 13*b* in this process. In other words, it is sufficient to form the resin around the solder bumps 13*b* so that only a top portion of each solder bump 13*b* can be exposed. In this case, a following removing process, which described herein below, may be omitted.

Figure 4C:
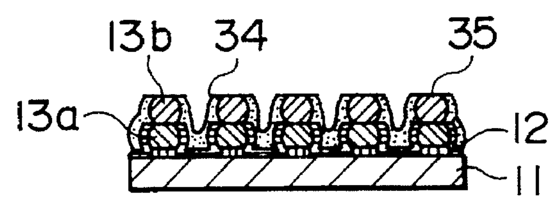

Secondly, carded out is the same removing process as described in the previous embodiment. The removing process achieves removing a part of the resin from each solder bump 13*b* so as to expose a top portion of each solder bump 13*b*. The top portion, exposed on the process, of each solder bump 13*b* is provided for forming a solder bump on the top portion, which is described herein after. In the preferred embodiment, each exposed top portion of the solder bumps 13*b* is nearly flat, and nearly the same area, that is a circle of a diameter of 0.63 mm., as that of the external electrode 12. Therefore, it also is preferable to truncate each solder bump 13*b* which are covered with the resin layer so as to expose its top portion 35, as shown in FIG. 4C. The removing process means encompassing both solder bumps 13*a* and 13*b* with the resin but the exposed top portion 35.

Finally, a process of forming solder bumps on the exposed top portions 35 of the solder bumps 13*b* is carried out in the same method as described in the previous embodiment. In the preferred embodiment of the invention, the process of forming solder bumps on the exposed top portions 35 also is performed both by stencilling flux onto the exposed top portions 35 through the first stencil and by stencilling solder balls onto the exposed top portions 35 through the second stencil. The process also involves reflowing to form the solder bumps on the exposed top portions 35. After alignment of the first stencil to the package 11, quantities of flux is provided through the openings in the first stencil onto the exposed top portions 35. The first stencil is then removed, leaving the package 11 containing the precise amount of the flux on each exposed top portion 35. Then, after alignment of the second stencil to the package 11, each solder ball is provided through the opening in the second stencil onto each exposed top portion 35 applied the flux. The solder balls, which are provided herein, have the same compositions as the solder balls provided in the process of forming solder bumps on the external electrodes 12. The solder balls employed herein, however, are not limited to the same solder balls as those employed in the process of forming solder bumps on the external electrodes 12, and various types of solder may be employed as the solder balls. The second stencil is then removed, leaving the package 11 mounting each solder ball on each exposed top portion 35.

Figure 4D:
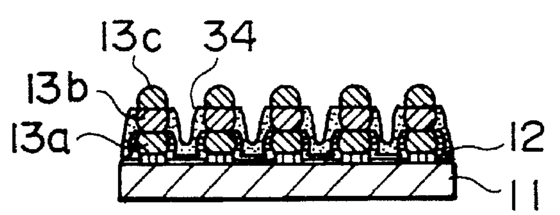
Figure 5:
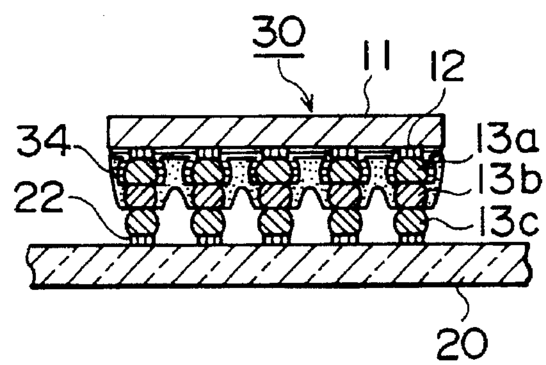
FIG. 5 is a cross sectional view of another bump grid array package, in accordance with the invention, positioned over contact pads on a substrate.

After processed two stencilling steps described above, the package 11 is heated as a whole. In the preferred embodiment, the infrared reflow oven which is employed in the previous embodiment, once again, is used as a heating means. In the infrared reflow oven, the package 11 is placed on the palette and passed through the oven by the conveyor. In operation, temperatures in the oven and conveyor speed are controlled adequately to mix each solder ball with the corresponding solder bump 13*b* at 230 degrees C. After the reflowing step, the solder balls are solidified and formed as solder bumps 13*c*, as shown in FIG. 4D. Each solder bump 13*c* assumes a shape of a truncated sphere having a diameter of approximately 0.8 mm., and is a part of solder joint which consists of the solder bumps 13*a*, 13*b*, 13*c* and the resin. In the reflowing process, the resin 34 withstands, that is it keeps its shape substantially, and still encompasses solder bumps 13*a* and 13*b*, for the resin is characteristic of not being molten at the highest temperature in the oven, as described above. Also, in the reflowing process, the resin which retains its shape prevents lower and middle parts of the solder joints, that is the solder bumps 13*a* and 13*b*, from being expanded in the horizontal direction by being mixed with the solder bumps 13*c*. After several processes described above, the package 11 having the three-bump solder joints is completed as shown in FIG. 4D. In FIG. 4D, as described above, the boundary lines between the solder bumps 13*b* and 13*c* are actually invisible by reason that the solder bumps 13*b* and 13*c* are molten and mixed each other in this embodiment. But, the boundary lines are indicated therein for a better explanation of the fabricating process. The solder joints of the package 11 are connected to corresponding contact pads on a substrate, and, of course, are higher than those of the BGAP 10. Such package is also defined as one type of BGAPs. The BGAP 30 in relation to this invention is shown in FIG. 5 to be mounted on the substrate 20. The solder joints of the BGAP 30 are soldered with the corresponding contact pads 22, to be electrically connected with other electrical/electronic devices on the substrate 20. In this embodiment, the above-described reflowing process, once again, is applied to soldering the solder joints with the contact pads 22 on the substrate 20. Furthermore, as applying the processes illustrated in FIG. 4 to the BGAP 30, a BGAP having four-bump solder joints may be assembled.

Figure 6:
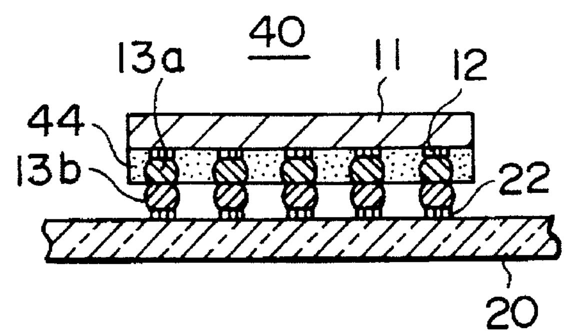
FIG. 6 is a cross sectional view of another bump grid array package in accordance with the invention.

In FIG. 6 is shown an alternate embodiment of the invention. FIG. 6 illustrates a cross sectional view of a BGAP 40 having two-bump solder joints which consist of solder bumps 13*a* and 13*b*. As contrast with the BGAP 10 shown in FIG. 3, it may be seen that the solder bumps 13*a* are molded into a non-conductive material 44, such as resin or plastic material. In this embodiment, the molding process is substituted for the process of forming a thin layer of resin over the solder bumps 13*a*, as described above. Preferably, the molding process consists of two steps, which are once molding the whole solder bumps 13*a* and removing a part of the non-conductive material 44 in order to expose a top portion of each solder bump 13*a*. More preferably, the removing step is slicing the non-conductive conductive material 44 and the solder bumps 13*a* in order to expose the top portion of each solder bump 13*a*.

In the present invention, how large the top portion 15 or 35 is formed is a trade-off between a solder bump height and a diameter of the constricted part of the solder joints. Preferably, the area of the exposed top portion 15 or 35, as in the embodiments, is formed as the same area as that of the external electrode 12, for its formation avoids being concentrated the shear strain into one of the constricted parts of each solder joint. The area of the external electrodes 12 and the volume of the solder balls are determined in consideration of the trade-off. This invention can also be applied to any other surface mounting leadless IC packages, bare chips, and flip-chips. It means that such elements will be substituted for the package 11 with the external electrodes 12.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for fabricating an electronic device having a plurality of solder joints, comprising the steps of:

(A) a stencilling flux onto an electrode through an opening in a first stencil, the electrode being electrically connected with a terminal of an electronic circuit;

(B) stencilling a first solder ball onto the electrode having the flux stencilled thereon through an opening in a second stencil;

(C) reflowing the first solder ball to form a first solder bump on the electrode;

(D) applying a first non-conductive material onto the first solder bump so as to encompass with the first non-conductive material an exposed area of the first solder bump but leaving exposed a top portion of the first solder bump;

(E) forming a second solder bump on the top portion of the first solder bump.

2. The method of claim 1, wherein step (E) comprises the steps of:

(E1) stencilling flux onto the top portion of the first solder bump through an opening in a third stencil;

(E2) stencilling a second solder ball onto the top portion of the first solder bump having the flux stencilled thereon through an opening in a fourth stencil, a volume of the second solder ball being substantially the same as that of the first solder ball;

(E3) reflowing the second solder ball to form the second solder bump on the top portion of the first solder bump.

3. The method of claim 1, wherein step (E) comprises the steps of:

(E1) stencilling flux onto the top portion of the first solder bump through an opening the first stencil;

(E2) stencilling a second solder ball onto the top portion of the first solder bump having the flux stencilled thereon through an opening in the second stencil;

(E3) reflowing the second solder ball to form the second solder bump on the top portion of the first solder bump.

4. A method for fabricating an electronic device having a plurality of solder joints, comprising the steps of:

(A) forming a first solder bump on an electrode, the electrode being electrically connected with a terminal of an electronic circuit;

(B) applying a first non-conductive material onto the first solder bump so as to encompass with the first non-conductive material an exposed area of the first solder bump but leaving exposed a top portion of the first solder bump;

(C) stencilling flux onto the top portion of the first solder bump through an opening in a first stencil;

(D) stencilling a second solder ball onto the top portion of the first solder bump having the flux stencilled thereon through an opening in a second stencil;

(E) reflowing the second solder ball to form a second solder bump on the top portion of the first solder bump.

* * * * *